United States Patent [19]

Prevost

[11] Patent Number: 4,993,954
[45] Date of Patent: Feb. 19, 1991

[54] DEVICE FOR INTERCONNECTION BETWEEN AND INTEGRATED CIRCUIT AND AN ELECTRICAL CIRCUIT

[75] Inventor: Michel Prevost, Le Plessis-Robinson, France

[73] Assignee: Thomson-CSF, Puteaux, France

[21] Appl. No.: 375,979

[22] Filed: Jul. 6, 1989

[30] Foreign Application Priority Data

Jul. 13, 1988 [FR] France ................. 88 09547

[51] Int. Cl.[5] ................................ H05K 3/30
[52] U.S. Cl. ............................. 439/68; 29/830; 29/832; 174/254; 357/51; 439/516
[58] Field of Search .............. 439/66, 68, 69, 516; 361/403, 409, 410, 414, 412, 418; 29/830, 847, 832; 174/260, 254; 357/51

[56] References Cited

U.S. PATENT DOCUMENTS

| | | | |
|---|---|---|---|
| 4,074,342 | 2/1978 | Honn et al. | 361/411 |
| 4,417,392 | 11/1983 | Ibrahim et al. | 29/840 |
| 4,874,721 | 10/1989 | Kimura et al. | 437/209 |

FOREIGN PATENT DOCUMENTS 0226433  6/1987  European Pat. Off. .
0284820 10/1988  European Pat. Off. .

OTHER PUBLICATIONS

IBM Bulletin, Johnson, vol. 21, No. 6, p. 2320, 11-1978.
IBM Bulletin, Martyak, vol. 14, No. 8, p. 2297, 1-1972.
IBM Technical Disclosure Bulletin, E. C. Layden, vol. 14, No. 4, p. 1316, 9-1971.
IBM Technical Disclosure Bulletin, vol. 28, No. 3, Aug. 1985-pp. 1184-1185.

Primary Examiner—Neil Abrams
Attorney, Agent, or Firm—Roland Plottel

[57] ABSTRACT

An object of the invention is a device for interconnection between an integrated circuit and an electrical circuit, such as a printed circuit. This device has, depending on the desired interconnection, an insulating platelet or several, stacked insulating platelets. Each of the platelets is crossed by a pre-determined number of electricity conducting channels without offset and by a pre-determined, non-zero number of electricity conducting channels with an offset in the plane of the platelet and in a direction that is prefixed and proper to the platelet. Selected conduction routes are established by burning out the non-selected channels. The device is placed between the active face of the integrated circuit and the electrical circuit. The choice of the number of platelets of the device, of their respective orientations, and of the number of channels with and without offset within each platelet, enables any correspondence whatsoever to be achieved between the contact zones of the integrated circuit and the connection points of the electrical circuit. Another object of the invention is a method for the fabrication of a platelet of this device.

10 Claims, 8 Drawing Sheets

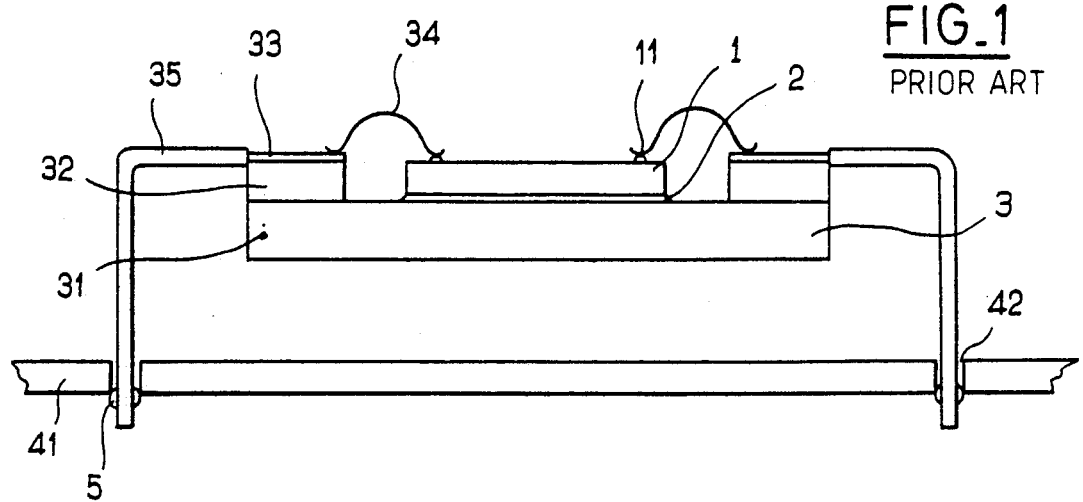
FIG_1
PRIOR ART
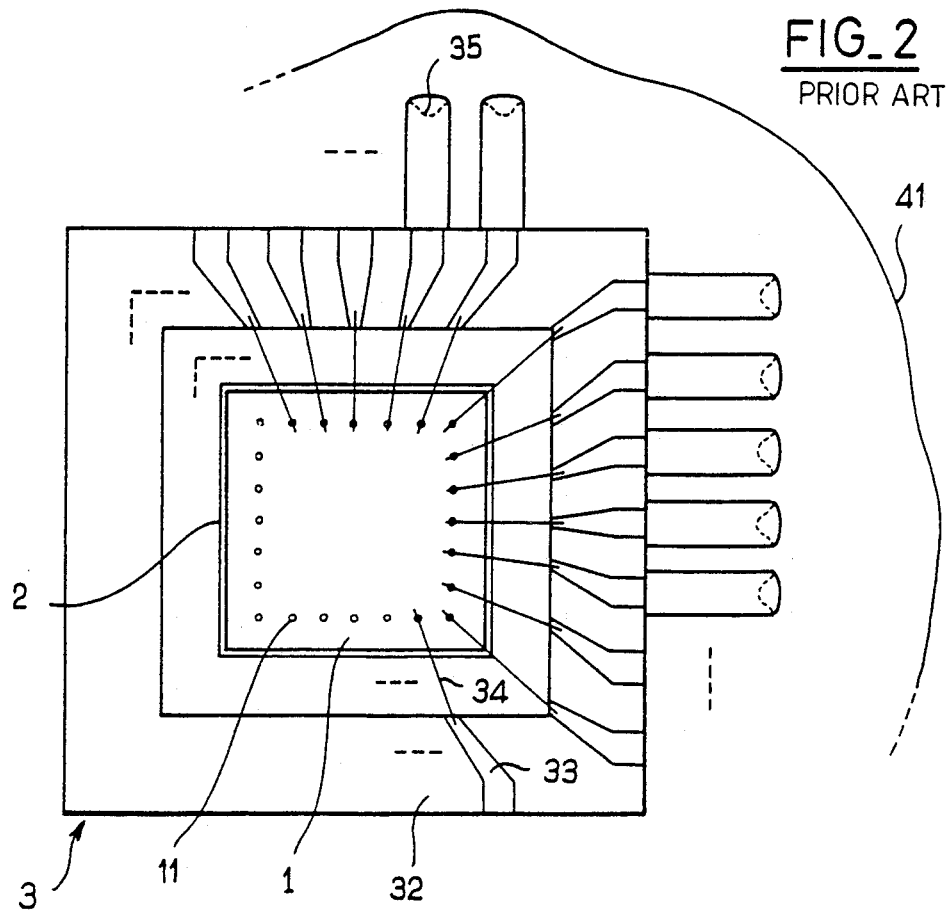
FIG_2
PRIOR ART

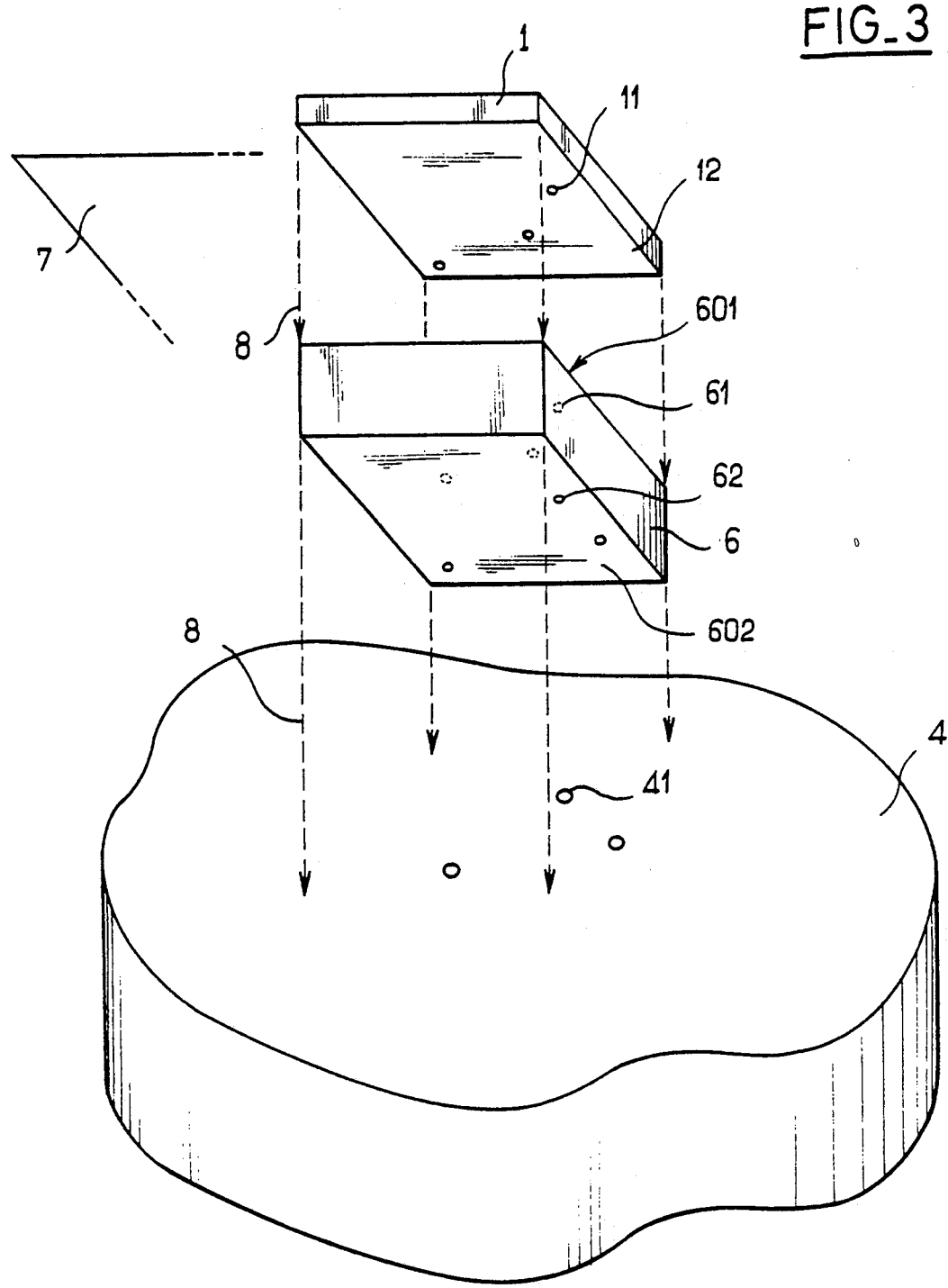
FIG_3

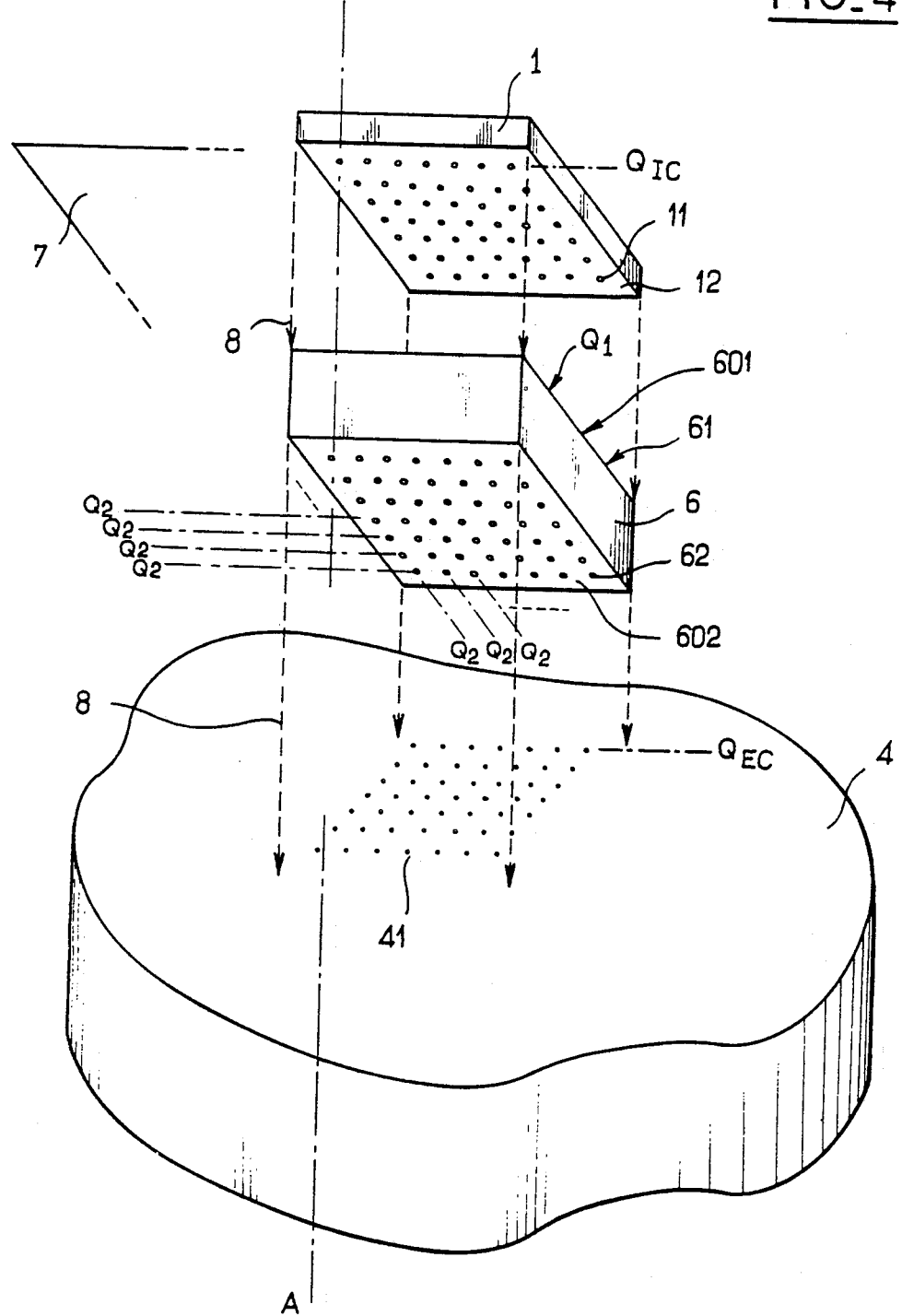
FIG_4

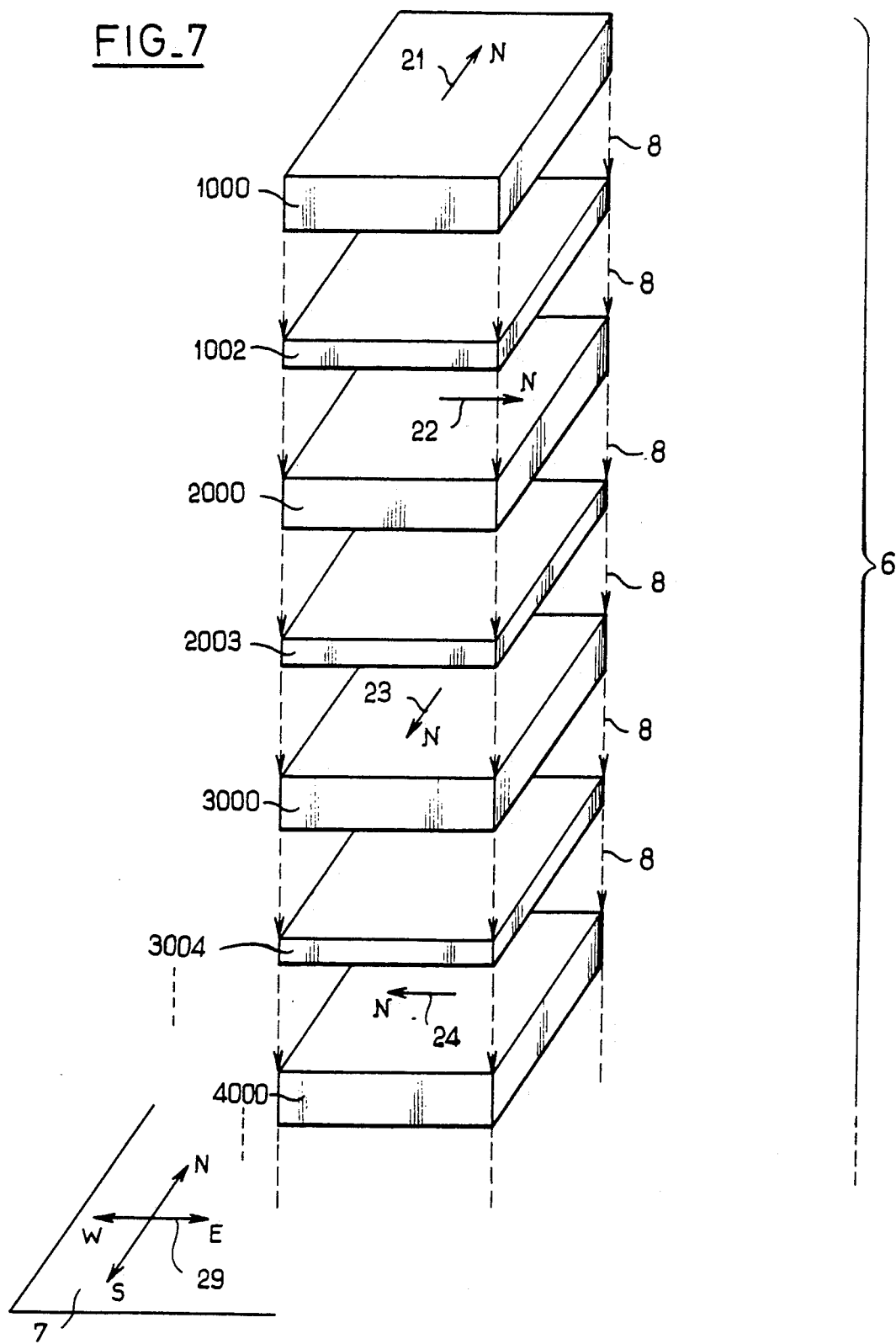

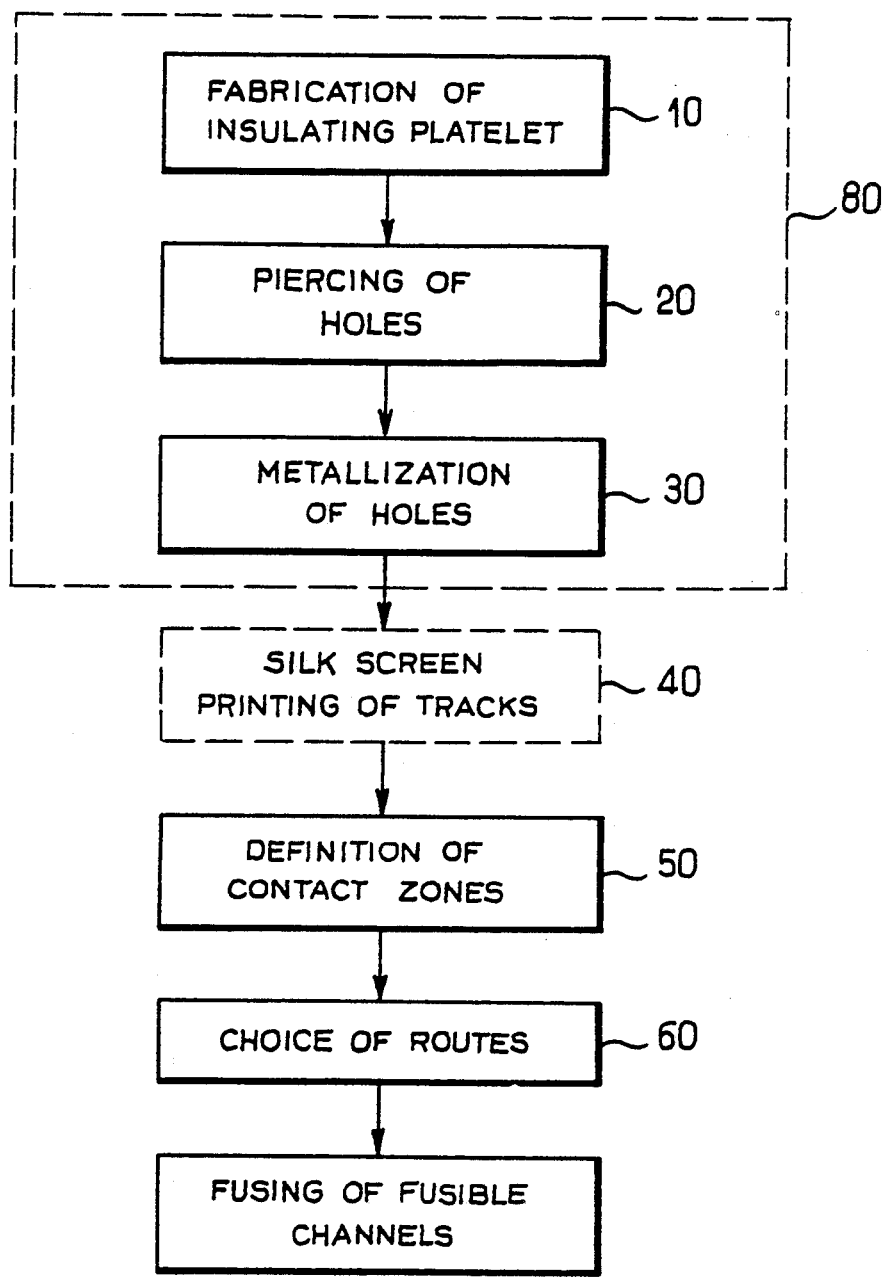
FIG_8

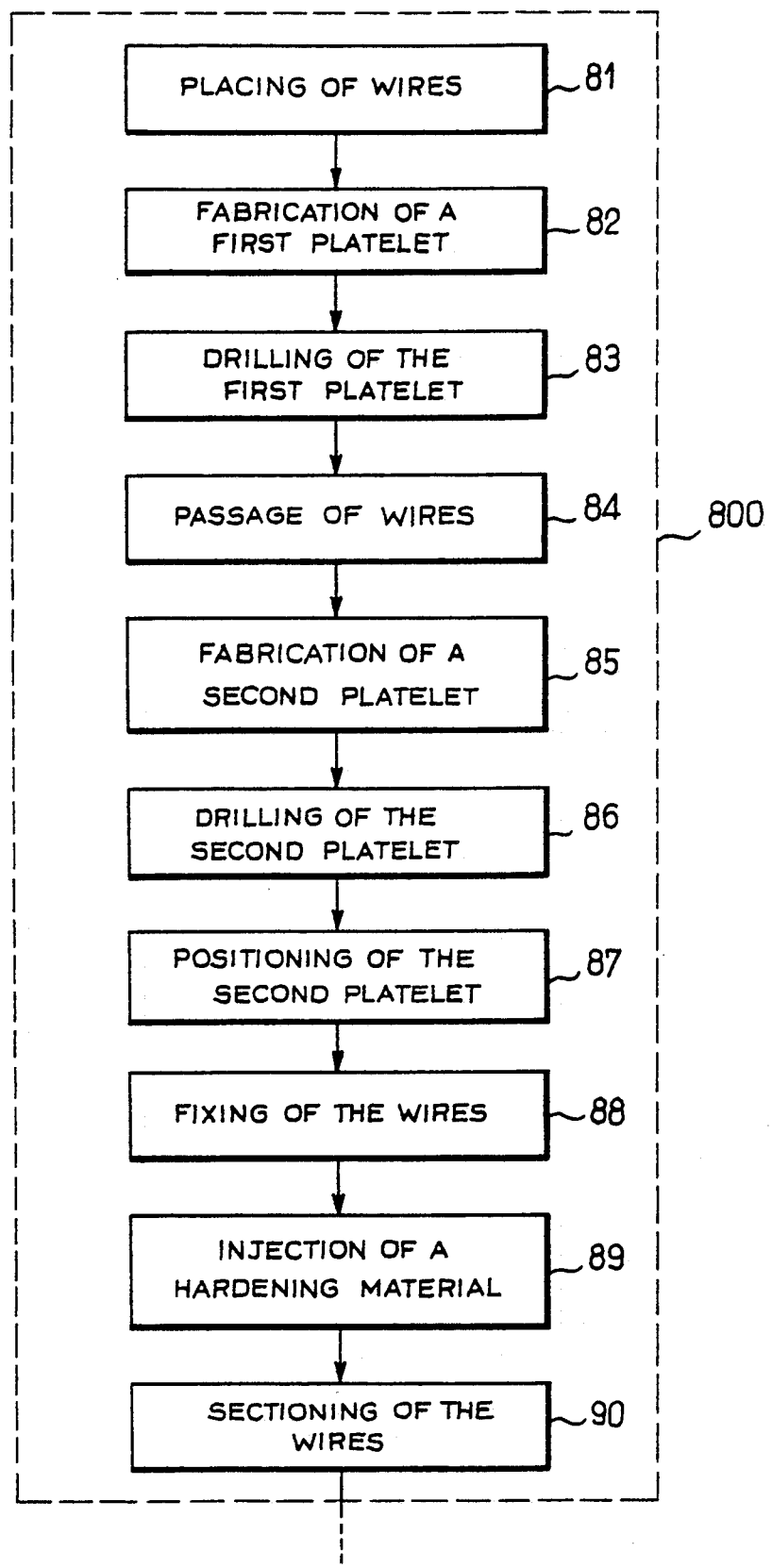

FIG_10
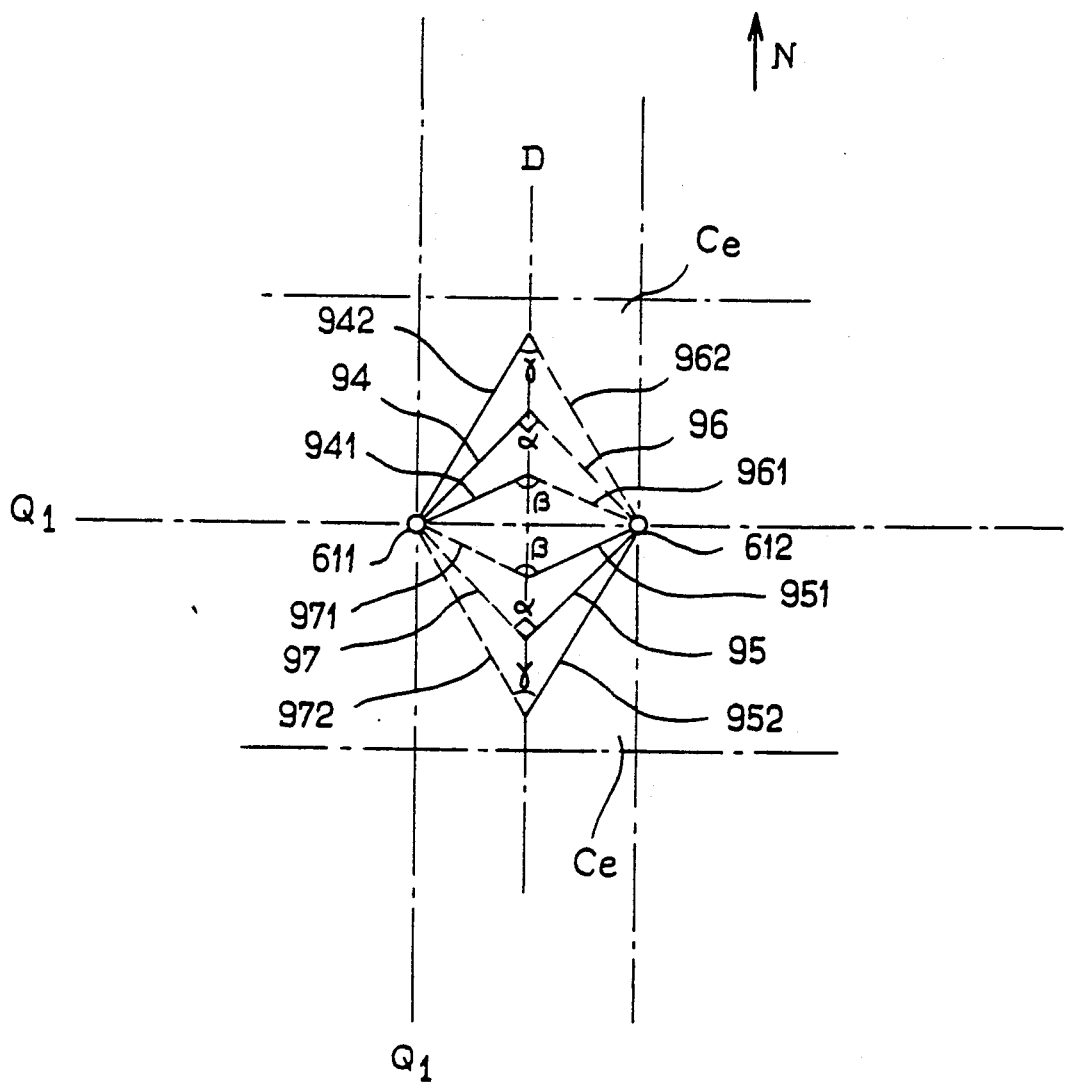

DEVICE FOR INTERCONNECTION BETWEEN AND INTEGRATED CIRCUIT AND AN ELECTRICAL CIRCUIT

BACKGROUND OF THE INVENTION

1. Field of the Invention

An object of the the present invention is a device for interconnection between an integrated circuit (markded IC) and an electrical circuit (marked EC) such as, for example, a printed circuit (marked PC), the EC having a face that is substantially parallel to the active face of the IC. The device is capable of connecting at least one contact zone of the IC and one connection point of the EC, which are offset with respect to one another in an abstract plane (called a "reference" plane) substantially parallel to the active face of the IC. Thus, whatever may be the correspondence desired between the contact zones of the IC and the connection points of the EC, the device enables a substantial reduction in the number or the length of the tracks made, in or on the IC or the EC, through a judicious choice of displacements, in the reference plane, within the device itself, it being possible to program a choice such as this. Another object of the invention is a device for the fabrication of a part of this device using a previously fixed number of modules of only one type.

The relative dimensions of the contact zones of an active face of an IC and of the connection points of an EC, such as, for example, a single-layer or multiple-layer PC, exclude the possibility of directly connecting the IC to the EC: it is necessary to interconnect the IC and the EC by means of a device with a fineness of connection in between that of the IC and that of the EC. A device of this type necessarily takes up space and complicates the manoeuvre wherein the interconnection is done.

Furthermore, the desired correspondence between the contact zones of the IC and the connection points of the EC may imply the making of additional tracks.

2. Description of the Prior Art

There are known devices for interconnection between an IC and an EC, comprising a base fabricated from an insulating material, located between the IC and the EC. The dimensions of this base, in said reference plane, are far greater than those of the IC to which is fixed the IC on the side opposite to its active face. The desired interconnection is provided by means of electrical conducting wires (called "bonding wires", the fineness of which is of the same magnitude as that of the contact zones of the IC) connecting the contact zones of the IC to electricity conducting tracks (the fineness of which is in between that of the contact zones of the IC and that of the connection points of the EC) which are made on and/or within the base, said tracks diverging around the IC, for example towards pins, which are designed to be plugged into holes of a PC. There is also a known arrangement where a base such as this is provided not with pins but with contact zones placed on the periphery of the face of the base located before the EC, connected to said tracks, for example, by means of a partial metallization of the sides of the base, and designed to be soldered to the connection points of the EC.

These known devices, however, have a great many drawbacks:

because of their fineness, the bonding wires are brittle. To reduce this brittleness to the minimum, these wires are as short as possible, and only reach places located on the periphery of the active face of the IC (in other words, the contact zones of the IC are peripheral): this firstly restricts the number of contact zones of an IC with a given area and, secondly, implies the making of track (in and/or on the IC) connecting the zones located at the center of the active face of the IC with its periphery;

again because of their fineness, the bonding wires are difficult to connect, both to the contact zones of the IC and to the tracks of the base;

the bonding wires are connected one by one, and this takes time;

since the dimensions of the base in the reference plane are greater than those of the IC, the interconnecting device is bulky;

this interconnection device cannot be used to compensate for any complexity of the correspondence desired between the contact zones of the IC and the connection points of the EC.

SUMMARY OF THE INVENTION

An object of the invention is an electrical device for interconnection between an IC and an EC, said device having at least one small plate, herein after called an offset platelet, made of an insulating material, the thermal expansion coefficient of which is preferably substantially equal to that of the IC. This platelet is placed between the active face of the IC and the EC (substantially parallel to said reference plane). The shape and the dimensions of this platelet in the reference plane are preferably substantially identical to those of the IC. Electrically conductive channels go through the platelet, at least partly with pre-determined offsets in the plane of reference, and provide for any connection between the contact zones of the IC and the connection points of the EC: the ends of these channels, which open out on a first face (located on the IC side) of the platelet, and those that open out on the second face (located on the EC side) of this platelet are respectively placed in front of the contact zones of the IC and the connection points of the EC. Hereinafter, these ends are also called contact zones of the first or second face of the platelet. The device also has assembling means which hold the platelet. By way of example, these means are formed by brazings, made simultaneously between all the contact zones of the first face of the platelet and all the contact zones of the IC, on the one hand, and between all the contact zones of the second face of the platelet and all the connection points of the EC on the other hand.

More precisely, an object of the invention is a device for interconnection between an integrated circuit IC having contact zones arranged on an active face and an electrical circuit EC having a surface substantially parallel to the active face of the IC, where connection points are located, said device connecting contact zones of the IC and connection points of the EC and comprising at least one platelet of a first type made of an electrically insulating material, placed between the active face of the IC and the EC, each of the faces of which comprises contact zones, the contact zones of a first face, located in front of the IC being arranged in front of the contact zones of the IC, and the contact zones of the second face, placed in front of the EC, being arranged in front of the connection points of the EC, said platelet further having internal means providing for electrical contact between the contact zones of said first face and those of said second face, assembling means providing for electrical contact between the contact zones of the IC and the contact zones of said first face, on the one hand, and between the contact zones of said second face and the connection points of the EC on the other hand, a device wherein:

the contact zones of said platelet have a size between that of the contact zones of the IC and that of the connection points of the EC, said internal means provide for an electrical contact with a pre-determined number of electricity conducting channels, going through the platelet without any offset, and a pre-determined and non-zero number of electricity conducting channels going through the platelet with an offset in an abstract plane of reference substantially parallel to the active face of the IC, said offfset taking place in a pre-fixed direction within one and the same platelet.

Another object of the invention is a method for the fabrication of a platelet of said device.

BRIEF DESCRIPTION OF THE DRAWINGS

Specific details, special features and various embodiments of the invention will appear during the following description, made with reference to the appended figures, of which:

FIG. 1 shows a sectional view of a prior art device for interconnection between an IC and an EC;

FIG. 2 shows a top view of the prior art device of FIG. 1;

FIG. 3 shows an exploded view of an embodiment of the device according to the invention, located between the two circuits (IC and EC) that it connects;

FIG. 4 shows an exploded view of a preferred embodiment of the device according to the invention located between the two circuits (IC and EC) that it connects;

FIG. 7 shows a non-detailed exploded view, in perspective, of a second alternative embodiment of the device of FIG. 4, drawn separately;

FIG. 8 shows a block diagram of a first variant of a method for the fabrication of a platelet of the device according to the invention;

FIG. 9 shows a block diagram of a second variant of a method for the fabrication of a platelet of the device of FIG. 1;

FIG. 10 shows a top view illustrating variants of the device of FIG. 4, drawn separately.

In these different figures, firstly, the real scale has not been maintained and, secondly, the same references relate to the same elements.

DESCRIPTION OF PREFERRED EMBODIMENTS

Figure 5:
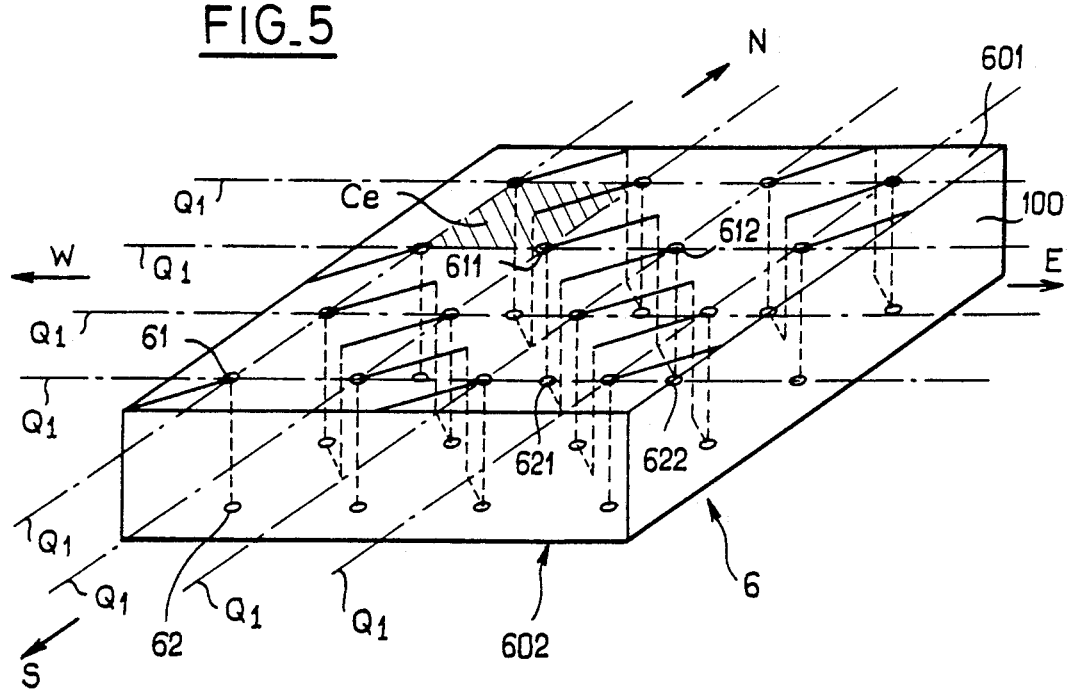
FIG. 5 shows a detailed view in perspective of a first alternative embodiment of the device of FIG. 4 drawn separately, and shown in the course of fabrication.

A prior art device, which has been described above, is shown, respectively in a sectional view and a top view, in FIGS. 1 and 2. An IC is fixed by a bonder 2 to a base 3. This base 3 comprises a supporting wafer 31 bearing the IC 1 on its top face, covered with a ring-shaped wafer 32, placed on the supporting wafer 31 and around the IC 1. The active face of the IC 1 is placed opposite the base 3 and has peripheral contact zones 11.

These contact zones are connected, by means of bonding wires 34 (soldered to each of their ends), to electricity conducting tracks 33 made by silk screen process on the ring-shaped wafer 2. These tracks 33 diverge (as shown in FIG. 2) towards pins 35 (which are soldered to the tracks 33). These pins 35 are, for example, plugged into holes 42 of a printed circuit 41 and are soldered to it by means of solders 5 according to a method known per se.

FIG. 3 gives a schematic exploded view of an embodiment of the device 6 according to the invention. This device 6 provides for the interconnection between an IC 1, having a number k of contact zones 11, located on its active face 12 (this active face 12 defines an abstract plane of reference 7 as been explained above) and an EC 4 having, for example, the same number k of connection points 41 which are on a surface substantially parallel to said plane of reference. The device 6 has a platelet, a first face 601 of which faces the active face 12 of the IC 1, and a second face 602 of which is located in front of said surface of the EC 4, these faces 601 and 602 being substantially parallel to the plane of reference. The platelet is made of an electrically insulating material and the thermal expansion coefficient of this platelet is, advantageously, substantially equal to that of the IC 1. The dimensions of the platelet in the plane of reference are, advantageously, substantially the same as those of the IC 1, which is, for example, square shaped. On the faces 601 and 602, there are contact zones 61 and 62, respectively facing contact zones 11 of the IC 1 and connection points 41 of the EC 4, the size of which is between that of the contact zones 11 of the IC 1 and that of the connection points 41 of the EC 4. The contact zones 61 of the first face 601 are connected, for example, biunivocal to the contact zones 62 of the second face 602 by fusible electricity conducting channels (not shown in this FIG. 3), at least one of which connects a given contact zone 61 (of the first face 601) to a given contact zone 62 (of the second face 602) offset in the reference plane 7 with respect to the contact zone 61 considered. In this FIG. 3, the IC 1, the device 6 and the EC 4 are shown at a distance from each other but these elements are actually in contact with each other, as indicated by the discontinuous arrows 8. A contact such as this is provided by assembling means formed, for example, by brazings made at each pair of contact zones (11, 61) and each pair comprising a contact zone and a connection point (62, 41): microvolumes of an electricity conducting material are either deposited or obtained by crystalline growth on either of the contact zones and/or connection points which have to be in contact. These microvolumes are then soldered to the contact zones and/or connection points that surround them. All the brazings corresponding to the setting up of contact of the IC and the device 6, respectively with the device 6 and the EC, namely all the brazings done at the pairs of contact zones (11, 61) respectively at the pairs formed by the contact zone and the connection point (62, 41) are made in a single operation.

The FIG. 4 gives a schematic exploded view of a preferred embodiment of the device 6 according to the invention where the contact zones 11 of the IC and the contact zones 61 and 62 of the faces 601 and 602 of the device 6 and the connection points 41 of the EC 4 are respectively placed at the vertices of four square grids $Q_{IC}$, $Q_1$, $Q_2$ and $Q_{EC}$. These four square grids $Q_{IC}$, $Q_1$, $Q_2$ and $Q_{EC}$ are substantially;
regular, identical,
identically oriented,
not offset with respect to one another as indicated by the axis A. According to this preferred embodiment, the IC 1 and the device 6 are preferably square. The rest of the description of FIG. 4 is similar to that of FIG. 3.

Figure 6:
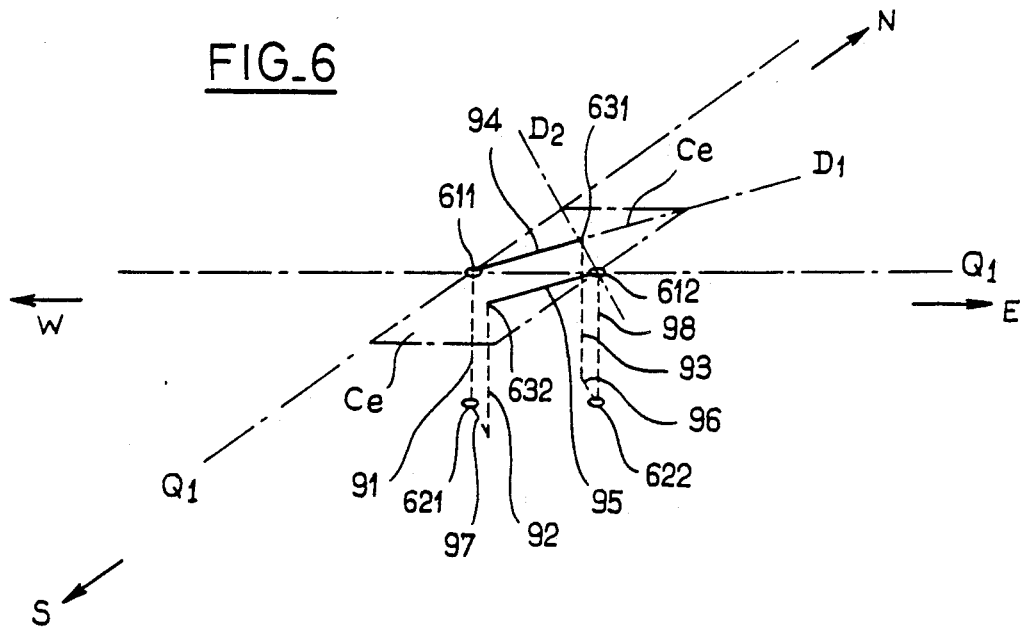
FIG. 6 shows a portion of the elements of FIG. 5.

FIG. 5 gives a detailed view of a first variant of the device 6 of FIG. 4, drawn separately and shown in the course of fabrication: before its use, this device is designed to undergo processing (explained here below) which depends on the desired correspondence between the contact zones of the IC and the connection points of the EC. This device 6 has a so-called offset platelet 100, called a "offset matrix stratum" (OMS) because it has at least one electricity conducting channel connecting a given contact zone 61 (of the first face 601) to a given contact zone 62 (of the second face 602) offset with respect to the contact zone 61 considered, as specified above. More precisely, as illustrated in FIG. 6 which represents a part of the elements of FIG. 5, one of the electricity conducting channels is capable of connecting:

either a contact zone 611 (612 respectively) located on the first face 601 to a contact zone 621 (622 respectively) located on the second face 602 of the platelet which is not offset (in other words, offset by a number p=0 of pitches of the square grid Q1 of the first face 601) with respect to the contact zone 611 (612 respectively) of the first face 601;

or a contact zone 611 (612 respectively), located on the first face 601, to a contact zone 622 (621 respectively) located on the second face 602 of the platelet offset by a number p=1 of pitches of the square grid $Q_1$ of the first face 601 in one of the two directions of this square grid $Q_1$.

The four geographic, cardinal points (north, east, south, west respectively marked N, E, S, W) are attributed to the OMS 100 in order to facilitate the description of the device 6 and its various elements.

An electricity conducting channel without offset has a transversal path 91, called a "direct" path (98 respectively) substantially rectilinear and substantially perpendicular to the plane of reference 7, going through a vertex 611 (612 respectively) of the square grid $Q_1$ of the first face 601.

An electricity conducting channel with an offset has, in this order:

a longitudinal track 94 (95 respectively), substantially rectilinear, made on a first face, 601, substantially parallel to a first diagonal $D_1$ of the square grid $Q_1$ (parallel to the direction S/W-N/E), the length of which is equal to half the diagonal of an elementary square Ce of the square grid $Q_1$;

a transversal path 93 (92 respectively) called an "indirect" path, which is substantially rectilinear and substantially perpendicular to the reference plane 7, passing through a center 631 (632 respectively) of the square grid $Q_1$ of the first face 601;

a longitudinal track 96 (97 respectively), substantially rectilinear made on the second face 602, substantially parallel to the second diagonal $D_2$ of the square grid $Q_1$ (parallel to the direction S/E-N/W), and of the same length as the longitudinal track 94 (95 respectively).

During the description of FIGS. 5 and 6, the square grid $Q_1$ of the first face 601 was arbitratily taken as a reference, but the square grid $Q_2$ of the second face 602 could have played the same role.

During the stage of fabrication of the device 6 shown in FIGS. 5 and 6, each contact zone 611 (612 respectively) of the first face 601 is connected, firstly, to a contact zone 621 (622 respectively) which is not offset and secondly, to a contact zone 622 (621 respectively) offset by a number p=1 of pitches of the square grid $Q_1$ in the direction E-W: the contact zones of the OMS 100 are therefore grouped in fours (two contact zones similar to the contact zones 611 and 612, and two contact zones similar to the contact zones 621 and 622).

Depending on the desired interconnection between the IC and the EC, in order to minimize the number or length of the tracks made in or on the IC or EC, two routes are chosen for each of these groups of four contact zones. This choice can be programmed. The fusible electricity conducting channels corresponding to non-chosen routes are burned out. According to the first alternative embodiment, illustrated by FIGS. 5 and 6, it is possible:

either to connect the contact zone 621 to the contact zone 611, and the contact zone 622 to the contact zone 612, which amounts to burning out the two electricity conducting channels, respectively formed by longitudinal tracks 94, 96 and 95, 97, on the one hand, and indirect transversal paths 93 and 92 on the other hand;

or to connect the contact zone 622 to the contact zone 611 and the contact zone 621 to the contact zone 612, which amounts to burning out the two channels respectively forming the direct transversal paths 91 and 98.

As explained above, the OMS 100 has at least one electricity conducting channel with an offset, namely at least one grouping of four contact zones 611, 612, 621, 622, connected according to the second choice.

FIG. 7 gives a non-detailed view, in perspective, of a second variant of the device 6 of FIG. 4 drawn separately. This device has a number n of preferably square platelets of a first type 1000, 2000, 3000, 4000, ... separated by a number n−1 of preferably square platelets of a second type, 1002, 2003, 3004, .... These platelets of a first type are substantially identical to the OMS 100 of the FIGS. 5 and 6 and the correspondence between the contact zones of a first face and the contact zones of the second face of each of the platelets of the first type, namely the choice of the routes within each of these OMS's, is proper to each of these OMS's. More precisely, each platelet of the first type is capable of introducing, for each grouping of four contact zones similar to the contact zones 611, 612, 621, 622 of the FIGS. 5 and 6, an offset in the direction E-W of the four cardinal points N, E, S, W proper to it (in FIG. 7, only the cardinal point N 21, 22, 23, 24 of each OMS of the first type 1000, 2000, 3000, 4000 has been drawn). A combination of the choice of the routes within each OMS, of the orientation of the OMS 1000, 2000, 3000, 4000, ..., with respect to each other and of the number n of OMS is therefore capable of providing for any correspondence whatsoever between the contact zones of the first face of the OMS 1000 facing the active face of the IC and those of the second face of the OMS facing the EC. In the particular example shown in FIG. 7, in a fixed reference 29 corresponding to the four cardinal points N, E, S, W of the reference plane 7:

the platelet 1000 provides at least one E-W offset;
the platelet 2000 provides at least one N-S offset;

the platelet 3000 provides at least one E-W offset;
the platelet 4000 provides at least one N-S offset.

According to the configuration of the OMS's 1000, 2000, 3000, 4000, ..., it is further indispensable to interpose, between these OMS's, platelets of a second type 1002, 2003, 3004, ..., the function of which is to insulate the longitudinal tracks of the second and first face respectively of a given OMS from those of the first and second respective face of an adjacent OMS. The platelets of the second type are called "insulation strata" (IS); they are similar to the OMS 100 of FIGS. 5 and 6 but have only direct transversal paths. The thickness of the IS's 1002, 2003, 3004, ..., is advantageously smaller than that of the OMS's 1000, 2000, 3000, 4000, ..., in order to reduce the dimension of the device 6 perpendicularly to the reference plane 7: in effect the IS's (unlike the OMS's) do not present any risks of breakdown between longitudinal tracks on either side of one and the same platelet.

A block diagram of the first alternative method of fabrication of a platelet of the device according to the invention is shown in FIG. 8. This diagram represents the steps of fabrication of an OMS similar to the OMS's 1000, 2000, 3000, 4000, ..., of FIG. 7, or the OMS 100 of FIG. 5.

These steps follow one another as follows:
a platelet, with a surface preferably having subustantially the same dimensions as those of the active face of the IC is fabricated according to a prior art method with an electrically insulating material, during a step 10;
holes are pierced, through the platelet, substantially perpendicularly to its faces, and to the vertices and centers of a substantially regular square grid during a step 20;
the inner surface of these holes is coated with an electrically conductive layer such as, for example, a layer of metal: this is a step 30;
electricity conducting tracks are made, for example by silk screen process, on each of the faces of the platelets, according to the drawing corresponding to FIGS. 5 and 6 during a step 40;
a definition of the contact zones of each of the faces of the platelet that it is sought to connect forms a step 50 (this definition depends on the desired correspondence between the contact zones of the IC and the connection points of the EC);
routes are chosen according to this definition during a step 60; these routes have crossings of the platelet in holes and offsets, on either face of the platelet, along said tracks made by silk screen process;
the electricity conducting holes and tracks not chosen during the preceding step 60 are treated so that they no longer conduct electricity: they are burned out. This operation is the step 70.

The steps 10, 20 and 30 form a stage 80 for the fabrication of a platelet having transversal paths and may be replaced by a stage 800. The block diagram of this stage 800 is given by FIG. 9 and comprises:
a sub-stage 81 for the placing of a number b, equal to the number of vertices and centers of a first square grid, of coils of an electricity conducting wire providing for a distribution of b wires at the vertices and centers of this first square grid;
a sub-stage (82, 83) for the fabrication of a first platelet, called a "mold platelet" made of a material that does not adhere to the insulating material, the surface area of which is at least equal to that of the platelet of the device, having b holes, distributed at the vertices and centers of the first square grid, each of the holes preferably having a section, the shape and dimensions of which are substantially the same as those of the wires;
a sub-stage 84 for the passage of the b wires respectively in the b corresponding holes of the first mold platelet;
a sub-stage (85, 86) for the fabrication and piercing of a second mold platelet having substantially the same characteristics as the former, and further having means to fix b wires;
a sub-stage 87 for the passage of the wires in the second mold platelet and the positioning of this second mold platelet;
a sub-stage 88 for the fixing of the b wires respectively in the b corresponding holes of said second mold platelet;
a sub-stage 89 for the injection of a hardening and electrically insulating material between the two mold platelet;
a sub-stage 90 for the sectioning of the b wires on either side of the hardening material after it has hardened, the b wires forming said transversal paths.

An IS similar to the IS's 1002, 2003, 3004, ..., of FIG. 7 is made according to a fabrication procedure that only has steps similar to those forming the stage 80 of FIG. 8 or 800 of FIG. 9, and the holes, furthermore, are made only at the vertices of the square grid.

Alternatives to the first and second embodiments of the device according to the invention are illustrated in FIG. 10. The longitudinal tracks 94 and 96 (97 and 95 respectively) of FIG. 6 form a right angle $\alpha$ with each other. The invention also covers two other configurations illustrated in FIG. 10, according to which these tracks 94 and 96 (97 and 95 respectively) are replaced by tracks 941 and 961 (971 and 951 respectively) forming an obtuse angle $\beta$ with each other, or else, by tracks 942 and 962 (972 and 952 respectively) forming an acute angle $\gamma$ with each other. These two types of tracks are such that the indirect transversal paths respectively connecting the tracks 94, 941 or 942, (95, 951 or 952 respectively) located on the first face of the platelet to the tracks 96, 961 or 962 (97, 971 or 972 respectively) located on the second face of the platelet, go through the mean perpendicular D of the positions of the two contact zones 611 and 612 of the first face.

The invention also covers embodiments according to which the pitch of the offset p is a whole number, strictly greater than 1.

What is claimed is:
1. A device for interconnection between an integrated circuit (IC), having contact zones arranged on an active face, and an electrical circuit (EC) having a surface substantially parallel to the active face of the IC, where connection points are located, said device connecting contact zones of the IC and connection points of the EC and comprising at least one platelet of a first type, made of an electrically insulating material and having a first and a second parallel faces, said device being placed between the active face of said IC and said surface of said EC and said platelet comprising:
contact zones on said first face located in front of said IC, said contact zones being arranged in front of the contact zones of said IC;
contact zones on said second face located in front of said EC, said contact zones of said second face being arranged in front of said connection points of said EC, said contact zones of said first and second faces having a size between that of the contact zones of the IC and that of the connection points of the EC; and internal means for providing electrical contact between the contact zones of said first face and the contact zones of said second face, said internal means including for each contact zone of said first face a fusible electricity conducting channel without an offset and at least one fusible electricity conducting channel with an offset, said offset taking place in a pre-fixed direction parallel to said first and second faces, within a given platelet, a selected conduction route being established between each contact zone of said first face and one contact zone of said second face by burning out all the fusible channels connected to said each contact zone but one; said device further comprising assembling means for providing electrical contact between the contact zones of said IC and the contact zones of said frst face, on the one hand, and between the contact zones of said second face and the connection points of said EC on the other hand.

2. A device according to claim 1, wherein:
said conducting channels without offset comprise a substantially rectilinear transversal path which is substantially perpendicular to said first and second faces;
said at least one conducting channels with offset comprise two substantially rectilinear, longitudinal tracks, made respectively on said first and second faces, and connected by a transversal path that is substantially rectilinear and substantially perendicular to said first and second faces.

3. A device according to claim 2, wherein the contact zones of the IC, of said first face and of said second face, and the connection points of the EC are respectively placed at the vertices of four substantially regular square grids, these four square grids being substantially identical, substantially identically oriented and substantially not offset with respect to each other parallel to said first and second faces.

4. A device according to claim 2, wherein said pre-fixed direction of offset is one of the two directions of one of the square grids of the faces of the platelet, and wherein said offset corresponds to a pre-fixed, strictly positive, whole number p of pitches of said square grid.

5. A device according to claim 4, wherein the number p is equal to 1.

6. A device according to claim 5, wherein:
the longitudinal tracks made on said first face are substantially parallel to a first oblique direction forming a pre-fixed angle with a first direction of one of the square grids of the faces of the platelet;
the longitudinal tracks made on said second face are substantially parallel to a second oblique direction symmetrical with said first oblique direction with respect to said first direction of said square grid.

7. A device according to claim 6, wherein said first and second oblique directions are respectively a first diagonal and a second diagonal of said square grids.

8. A device according to claim 1 wherein the dimensions of the platelet in a plane parallel to said first and second faces are substantially equal to those of the IC.

9. A device according to claim 2 comprising:
a number n of platelets of said first type, stacked and placed between the active face of the IC and said EC, the respective directions of offset of the platelets of the first type being capable of orientation substantially perpendicularly or substantially in parallel with respect to one another;
a number n-1 of platelets of a second type, interposed between the platelets of the first type, made of an electrically insulating material, each of the faces of which has contact zones of a size between that of the contact zones of the IC and that of the connection points of the EC, the contact zones of the two faces of a platelet of the second type being connected by electricity conducting channels that go through this platelet without any offset,
assembling means providing for an electrical contact between, on the one hand, the contact zones of a face of a platelet of the first type and, on the other hand, the contact zones of a platelet of the second type.

10. A device according to claim 1 wherein said assembling means comprise microvolumes of an electricity conducting material, formed on at least one of contact zones which have to be in electrical contact, each of said microvolumes having been soldered to the contact zones that surround it, all the solders, corresponding to two facing surfaces, having been made in a single operation.

* * * * *